Figure 1:
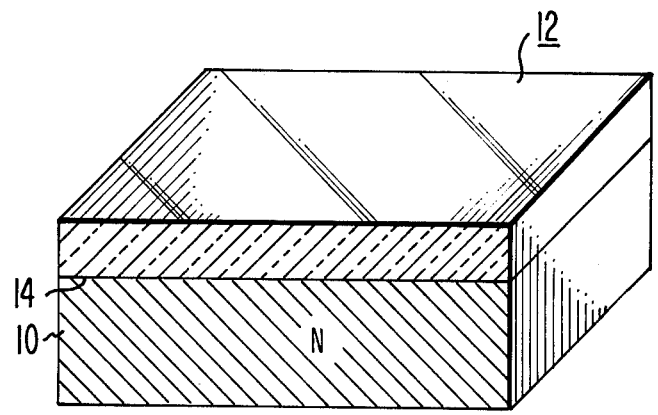

United States Patent [19]

Rosnowski

[11] 4,213,807
[45] Jul. 22, 1980

[54] METHOD OF FABRICATING SEMICONDUCTOR DEVICES

[75] Inventor: Wojciech Rosnowski, Summit, N.J.

[73] Assignee: RCA Corporation, New York, N.Y.

[21] Appl. No.: 32,027

[22] Filed: Apr. 20, 1979

Related U.S. Application Data

[63] Continuation of Ser. No. 803,722, Jun. 6, 1977, abandoned.

[51] Int. Cl.[2] .................. H01L 21/225; H01L 21/308
[52] U.S. Cl. ..................................... 148/187; 148/188; 156/637; 156/653; 156/656; 156/657; 156/659.1; 427/88; 427/93; 430/319
[58] Field of Search ............. 156/637, 652, 653, 656, 156/657, 659; 148/188, 187; 427/93, 88

[56] References Cited

U.S. PATENT DOCUMENTS

| | | | |
|---|---|---|---|
| 3,415,679 | 12/1968 | Chuss | 156/657 |
| 3,437,533 | 4/1969 | Dingwall | 148/188 |
| 3,535,771 | 10/1970 | Meer et al. | 148/188 |
| 3,661,660 | 5/1972 | Wessells | 156/637 |
| 3,887,993 | 6/1975 | Okada et al. | 148/188 |
| 4,076,860 | 2/1978 | Kuroda | 156/661 |

*Primary Examiner*—Jerome W. Massie
*Attorney, Agent, or Firm*—H. Christoffersen; R. A. Hays; R. Ochis

[57] ABSTRACT

A method of fabricating a semiconductor device comprising the steps of disposing a layer of dopant material over exposed portions of a surface of a semiconductor body and over portions of a masking layer adjacent the exposed portions, the dopant material having a diffusion coefficient through the masking layer at least about as large as its diffusion coefficient into the body. The dopant material is selectively etched to remove portions overlying the masking layer and thereafter remaining portions of the masking layer are etched to remove any dopant material which might still remain thereover.

14 Claims, 6 Drawing Figures

METHOD OF FABRICATING SEMICONDUCTOR DEVICES

This is a continuation, of application Ser. No. 803,722, filed June 6, 1977, now abandoned.

This invention generally relates to the fabrication of semiconductor devices and, in particular, relates to the selective diffusion of conductivity modifiers into a body of semiconductor material.

During the fabrication of certain types of semiconductor devices, such as power devices, regions of different type conductivities are formed within a body of semiconductor material. One conventional technique for forming such regions is to first form a masking layer on a surface and define it, for example, by known photolithographic and etching methods, to expose preselected portions of the surface. Next, a layer of material comprising the desired impurity, or dopant, is formed over both the remaining portions of the masking material and the exposed portions of the surface. Thereafter the impurity is driven, usually at an elevated temperature, from the layer into the body to form the region.

However, in the case where the impurity has a diffusion coefficient with respect to the masking material which is at least about the same as its diffusion coefficient with respect to the body, a problem is created. That is, under these conditions the impurity can easily randomly diffuse through the remaining portions of the masking material into the body where it is not wanted. These random regions can make the device being fabricated unusable.

One solution to this problem would be to select a combination of impurity and masking material in which the diffusion coefficient of the impurity through the masking material is much less than through the semiconductor body. But this is not always practical. Another solution to this problem is to perform a masking, photolithographic and etching procedure to remove all of the layer comprising the impurity from the remaining portions of the masking material. But such an etching procedure does not necessarily insure that all of the dopant layer over the masking material is removed and therefore islands of the impurity-containing layer can remain on the masking material to be diffused into the body through the mask. Such islands may remain, for example, because: (a) some of the photoresist was not completely developed during the photolithographic step; or (b) the etching time was too short to completely remove all of the impurity layer overlying the masking material, or (c) the layer comprising the impurities was partially passivated and those areas had reduced etching rates.

A method embodying the principles of the present invention includes at least two etching steps utilizing different etchants to insure the removal of substantially all of the dopant material which is initially disposed over the remaining portions of the masking material.

In the drawing:

FIGS. 1 through 6 are perspective views, partially in section, of a typical semiconductor device, not drawn to scale, during various stages of fabrication utilizing a method embodying the principles of the present invention.

With reference to FIG. 1 the workpiece upon which this method is performed, for example, a body of semiconductor material, indicated generally at 10, is shown having a masking layer 12 on a surface 14 thereof. As an example, the body 10 comprises N type silicon and the masking layer 12 comprises silicon dioxide. Techniques for providing the masking layer 12 of silicon dioxide, as well as other diffusion masking layers, such as silicon nitride, are well known in the art. In the preferred embodiment, however, the masking layer 12 is comprised of silicon dioxide which is thermally grown on the silicon body 10 to a thickness on the order of between 10,000 Å and 14,000 Å. The formation of such a layer 12 can be accomplished, for example, by placing the body 10 in an oxidizing ambient, such as steam, at a temperature of between 1000° C. and 1200° C. for between about 7 to 3 hours, respectively.

Figure 2:
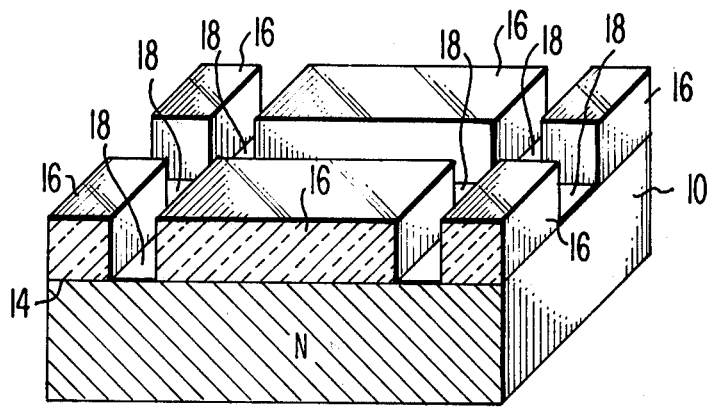

As shown in FIG. 2, the masking layer 12 is defined into a predetermined pattern 16 whereby surface portions 18 of the body 10 are exposed therethrough and portions of the masking layer 12 remain. The selective removal step can be performed using known techniques, for exmple etching and photolithographic techniques.

One such technique involves coating the masking layer 12 with a photosensitive material (not shown) and exposing it to ultraviolet light through a photomask (also not shown) which is opaque except for the predetermined pattern 16. The photoresist (positive type) is next developed and those portions of the photoresist material exposed to the ultraviolet light are removed. Then the masking layer 12 is subjected to an etching procedure during which those preselected portions of the masking layer 12 are removed to expose surface portions 18 of the body 10.

Figure 3:
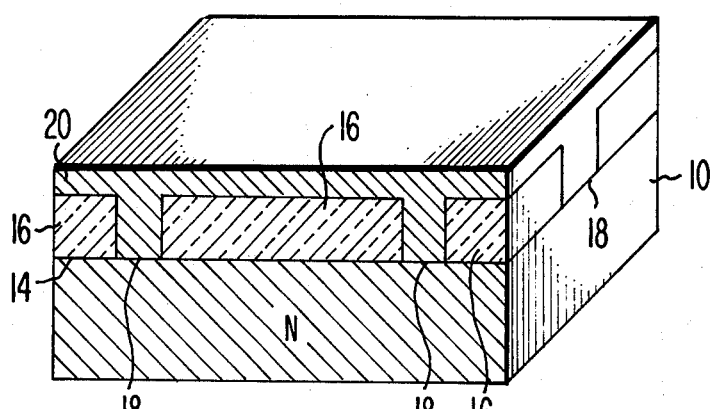

A layer of dopant material 20 shown in FIG. 3, is disposed over the masking layer 12 as well as over the previously exposed surface portions 18 of the body 10. Preferably the dopant material 20 is disposed in such a manner that diffusion into the body 10 through the exposed surface portions 18 is substantially avoided. For example, if the dopant material is aluminum, the layer 20 can be disposed by known evaporation techniques while maintaining the body 10 at a temperature which is about equal to room temperature, i.e., about 25° C. This can be accomplished by evaporating an aluminum source in a vacuum system in which the body 10 is positioned above the aluminum source so that it is substantially unaffected by the heating of the aluminum, yet is exposed to the vapor thereof. According to the principles of this invention, the dopant material has a diffusion coefficient with respect to the masking layer 12 which is at least about equal to that of its diffusion coefficient into body 10. Preferably, the formation of layer 20 of dopant material is carried out until it has a thickness of about 10,000 Å.

Using known photolithographic and etching methods, the dopant material is removed from the remaining portions of the masking layer 12. This step is carried out for example, by disposing a coating 22 of photosensitive material, see FIG. 4, over the layer 20 of dopant material and exposing it to light radiation so that when exposed to an etchant, for example, phosphoric acid, the aluminum overlying the masking layer 12 is substantially removed. The etching step preferably takes place at a temperature on the order of about 150° C. for about one to two minutes. Other etchants, such as a solution comprising phosphoric acid and nitric acid can also be used.

Figure 4:
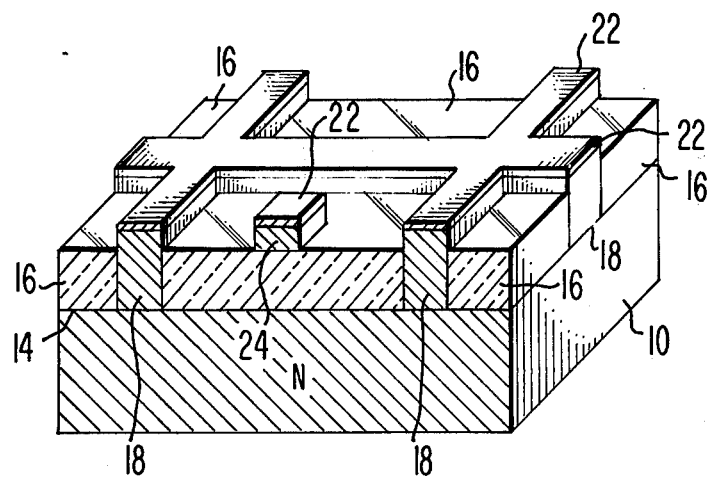

As shown in FIG. 4, however, the etching step can be imperfect and cause islands 24 of aluminum to remain over the masking layer 16. The presence of these islands 24 is generally caused by, among other reasons, for example, (a) some of the photoresist 22 being incompletely developed and thus the aluminum not being reached by the etching solution, or (b) the aluminum can be partially passivated and have a lower etching rate at those locations, or (c) the etching time could have been too short to remove all of the aluminum.

According to the principles of this invention, in order to insure the complete removal of these islands 24, the body 10 is etched a second time before the dopant is diffused. The second etching step is one which utilizes an etchant which selectively attacks the silicon dioxide. That is, one which attacks the silicon dioxide at a much faster rate than it attacks the aluminum. One such etchant, for example, comprises a 10% to 50% buffered hydrofluoric acid. The second etching step preferably takes place at room temperature and can be carried out for about 10 minutes. The etching time can be shortened to about 5 minutes by megasonically agitating the etchant.

Figure 5:
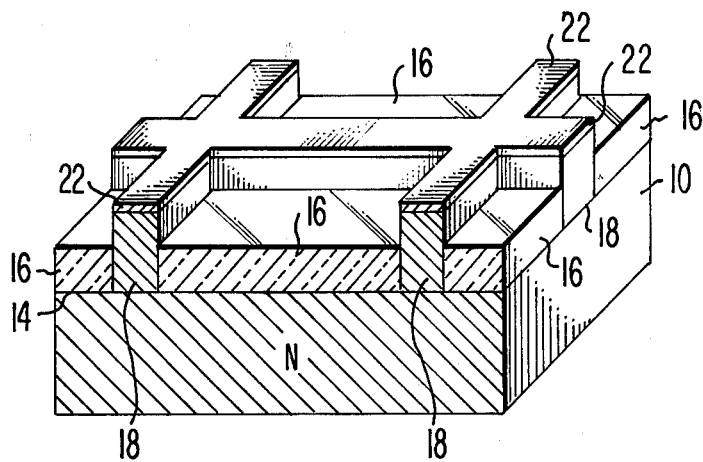

As shown in FIG. 5, since the aluminum that is to remain is still covered with photoresist, only the remaining portions of the silicon dioxide are substantially attacked by this second etching step. During this second etching step, the remaining portions of the silicon dioxide are removed in such a manner that any islands 24, such as the one shown in FIG. 4, are undercut and washed away during a subsequent cleaning step or during the megasonic agitation.

The length of time necessary to remove any particular island 24 is, of course, dependent upon its size and thickness and therefore varies accordingly. It should be noted, however, that the complete removal of the remaining portions of the masking layer 12 are ordinarily not necessary for the removal of the islands 24. On the other hand, to insure that all of the islands 24 are removed, all of the remaining portions of the masking layer 12 can be removed. Therefore, the island removing etching step should be carried out for a time which is long enough to remove the islands 24.

Figure 6:
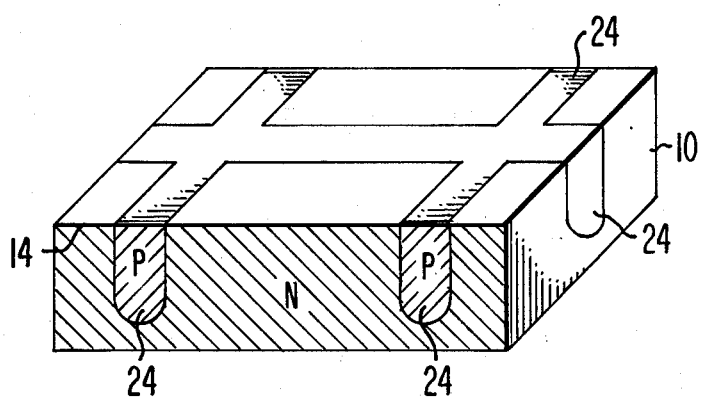

As shown in FIG. 6, the aluminum can now be diffused into the body 10 to form doped regions 24, for example of P type conductivity. This diffusion step is preferably carried out at a temperature between 1250° C. and 1300° C. for about 50 to about 20 hours, respectively. Such a diffusion step results in P type regions 24 which are on the order of about 5 to 6 mils deep and having a surface carrier concentration on the order of about $10^{17}$ atoms/cm$^3$.

The method described above permits the utilization of silicon dioxide, which is a well known masking material and relatively easy to form using known technology, as an initial masking layer 16 for, for example, aluminum which is generally known to diffuse relatively easily therethrough. As a result, aluminum can be more readily diffused into a body 10 without the need for extraordinary measures, such as multiple masking layers to prevent the formation of random pockets within the body 10.

What is claimed is:

1. A method of fabricating a semiconductor device comprising the steps of:

first forming a first layer of masking material on a surface of a body of semiconductor material;

removing preselected portions of said first masking layer to expose surface portions of said body, other portions of said first masking layer remaining on said surface;

disposing a layer of dopant material over said other remaining portions of said first masking layer and said exposed surface portions, said dopant having a diffusion coefficient with respect to said first masking material which is at least about as large as its diffusion coefficient in said body material, said dopant material being one which induces a first conductivity type;

second forming a second masking layer over said layer of dopant material and selectively retaining said second masking layer to protect those portions of said layer of dopant material which overlie said exposed surface portions, while leaving the rest of said layer of dopant material unprotected;

first etching said unprotected portions of said layer of dopant material in an attempt to remove at least substantially all of said dopant material from said other remaining portions of said first masking layer;

second etching said other remaining portions of said first masking layer with an etchant which selectively attacks said first masking material, said second etching being carried out for a time which is long enough to remove any islands of said doping material on said other remaining portions of said first masking layer which may not have been removed in said first etching step; and heating said body to a diffusion temperature for said dopant material in said body for a time sufficient to produce a diffused region of a desired depth, the conductivity type of said diffused region being controlled by said dopant and said diffused region being at least partially bounded by a PN junction with a portion of said semiconductor body not having said first conductivity type.

2. The method recited in claim 1 wherein said disposing step comprises disposing a layer of aluminum dopant material over said other remaining portions of said first masking layer and said exposed surface portions.

3. The method recited in claim 1 wherein said first masking layer consists substantially of silicon oxide.

4. A method as claimed in claim 3 wherein:
   said second etching step is carried out for a time which is long enough that said islands are removed but short enough to leave some of said first masking material on said surface.

5. A method as claimed in claim 3 wherein:
   said disposing step is performed in a manner causing substantially no diffusion of the dopant into said body during said disposing step.

6. A method as claimed in claim 3 further comprising:
   megasonically agitating said etchant during said second etching step.

7. A method as claimed in claim 3 wherein:
   said second etching step is carried out for a time long enough to remove said other remaining portions of said first masking layer.

8. A method as claimed in claim 3 wherein said body is silicon and said first forming step comprises:
   thermally growing a masking layer of silicon dioxide on said surface of said body.

9. The method recited in claim 8 wherein said thermally growing step produces a silicon dioxide layer about 10,000 angstroms thick.

10. Method of fabricating a silicon semiconductor device comprising the steps of:
    first forming a first masking layer of silicon oxide on a surface of a body of semiconductor material;

removing preselected portions of said first masking layer to expose surface portions of said body, other portions of said first masking layer remaining on said surface;

disposing a layer of aluminum dopant material over said other remaining portions of said first masking layer and said exposed surface portions, said aluminum having a diffusion coefficient with respect to said silicon oxide masking material which is large enough that allowing the aluminum to remain on said silicon oxide masking layer during diffusion of said aluminum into said semiconductor material would be detrimental to the intended device characteristics;

second forming a second masking layer over said layer of aluminum dopant material and selectively retaining said second masking layer to protect those portions of said layer of aluminum dopant material which overlie said exposed surface portions, while leaving the rest of said layer of aluminum unprotected;

first etching said unprotected portions of said layer of aluminum in an attempt to remove substantially all of said aluminum from said other remaining portions of said silicon oxide layer; and second etching said other remaining portions of said silicon oxide layer with an etchant which selectively attacks said silicon oxide masking material, said second etching being carried out for a time which is long enough to remove any islands of aluminum on said other remaining portions of said silicon oxide masking layer which may not have been removed in said first etching step; and heating said body to a diffusion temperature for said aluminum dopant material in said silicon semiconductor body for a time sufficient to produce a P type diffused region of a desired depth in which the conductivity type of said diffused region is controlled by said aluminum dopant material and said diffused region is at least partially bounded by a PN junction with a portion of said semiconductor body having an N type conductivity.

11. A method of fabricating a semiconductor device comprising the steps of:

first forming a first layer of masking material on a surface of a body of semiconductor material;

removing preselected portions of said first masking layer to expose surface portions of said body, other portions of said first masking layer remaining on said surface;

disposing a layer of dopant material over said other remaining portions of said first masking layer and said exposed surface portions, said dopant having a diffusion coefficient with respect to said first masking material which is at least about as large as its diffusion coefficient in said body material, said dopant material being one which induces a first conductivity type;

second forming a second masking layer over said layer of dopant material and selectively retaining said second masking layer to protect those portions of said layer of dopant material which overlie said exposed surface portions, while leaving the rest of said layer of dopant material unprotected;

first etching said unprotected portions of said layer of dopant material in an attempt to remove substantially all of said dopant material from said other remaining portions of said first masking layer;

second etching said other remaining portions of said first masking layer with an etchant which selectively attacks said first masking material, said second etching being carried out for a time which is long enough to remove any islands of doping material on said other remaining portions of said first masking layer which may not have been removed in said first etching step; and heating said body to a diffusion temperature for said dopant material in said body for a time sufficient to produce a diffused region containing said dopant material of a desired depth in said body, at least a portion of said diffused region bounded by a PN junction with a portion of said body of a second conductivity type opposite to said first conductivity type.

12. The method recited in claim 11 wherein:
said second etching step is carried out for a time which is such that said islands are removed, but for a time short enough to leave some of said first masking material on said surface.

13. The method recited in claim 12 wherein said first masking material is silicon oxide.

14. The method recited in claim 11 wherein said disposing step comprises disposing a layer of aluminum dopant material over said other remaining portions of said first masking layer and said exposed surface portions and said PN junction is with an N type portion of said body.

* * * * *

Disclaimer 4,213,807.—*Wojciech Rosnowski*, Summit, N.J. METHOD OF FABRICATING SEMICONDUCTOR DEVICES. Patent dated July 22, 1980. Disclaimer filed May 16, 1983, by the assignee, *RCA Corp.*

Hereby enters this disclaimer to claims 1, 2, 11 and 14 of said patent.

[*Official Gazette August 16, 1983.*]